(12) United States Patent
Okada et al.

(10) Patent No.: US 11,505,862 B2
(45) Date of Patent: Nov. 22, 2022

(54) METHOD FOR PREVENTING CONTAMINATION OF BASE PLATE

(71) Applicant: Shin-Etsu Chemical Co., Ltd., Tokyo (JP)

(72) Inventors: Tetsuro Okada, Niigata (JP); Naruhiro Hoshino, Niigata (JP); Masahiko Ishida, Niigata (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 17/187,963

(22) Filed: Mar. 1, 2021

(65) Prior Publication Data

US 2021/0285099 A1  Sep. 16, 2021

(30) Foreign Application Priority Data

Mar. 10, 2020  (JP) .............................. JP2020-041075

(51) Int. Cl.
 *C23C 16/44*  (2006.01)
 *C23C 16/24*  (2006.01)
 *C01B 33/035*  (2006.01)

(52) U.S. Cl.
 CPC ........ *C23C 16/4401* (2013.01); *C01B 33/035* (2013.01); *C23C 16/24* (2013.01)

(58) Field of Classification Search
 CPC ... C23C 16/4401; C23C 16/24; C01B 33/035; C01B 33/027
 See application file for complete search history.

(56) References Cited

U.S. PATENT DOCUMENTS

| | | | |
|---|---|---|---|
| 5,620,525 A * | 4/1997 | van de Ven | H01L 21/68771 118/724 |
| 6,413,321 B1 * | 7/2002 | Kim | C23C 16/0209 438/758 |
| 7,927,423 B1 * | 4/2011 | Abbott | C23C 14/24 210/324 |
| 2002/0173170 A1 * | 11/2002 | Liang | H01L 21/316 257/E21.271 |
| 2011/0036709 A1 * | 2/2011 | Hawrylchak | H01L 21/67017 204/298.11 |
| 2012/0177543 A1 * | 7/2012 | Battrell | F04B 43/043 422/187 |

(Continued)

FOREIGN PATENT DOCUMENTS

| | | | |
|---|---|---|---|
| CN | 104918883 A * | 9/2015 | ........... C01B 33/035 |
| CN | 204789066 U * | 11/2015 | ............... G01N 1/22 |

(Continued)

OTHER PUBLICATIONS

Zou, Xingli, et al., "Electrodeposition of crystalline silicon films from silicon dioxide for low-cost photovoltaic applications". Nature Communications, 2019, 10:5772, pp. 1-7.*

(Continued)

*Primary Examiner* — Bret P Chen

(74) *Attorney, Agent, or Firm* — Ladas & Parry, LLP

(57) ABSTRACT

A method for preventing contamination of a base plate having a step of, after producing polycrystalline silicon in a reactor having the base plate and a lid covering the base plate, removing the lid from the base plate; and a step of isolating space including the base plate by an isolation device.

6 Claims, 4 Drawing Sheets

(56) References Cited

U.S. PATENT DOCUMENTS

| | | | |
|---|---|---|---|
| 2015/0364323 A1* | 12/2015 | Mueller | H01L 21/02532 |
| | | | 438/488 |
| 2016/0045940 A1 | 2/2016 | Hertlein et al. | |
| 2016/0273099 A1 | 9/2016 | Wochner | |
| 2017/0305748 A1 | 10/2017 | Popp et al. | |
| 2019/0058242 A1* | 2/2019 | Tabe | H01Q 1/248 |
| 2019/0248657 A1 | 8/2019 | Ito | |

FOREIGN PATENT DOCUMENTS

| | | | |
|---|---|---|---|
| DE | 20 2011 103 798 U1 * | 12/2012 | C01B 33/027 |
| EP | 2734471 B1 * | 12/2017 | B01J 19/24 |
| JP | H05025241 U | 4/1993 | |
| JP | 2006242419 A | 9/2006 | |
| JP | 2016521239 A | 7/2016 | |
| JP | 2016536249 A | 11/2016 | |
| JP | 2018100805 A | 6/2018 | |
| JP | 6395924 B2 | 9/2018 | |
| WO | WO 2014/143910 A1 * | 3/2014 | F16J 15/12 |
| WO | 2017221952 A1 | 12/2017 | |

OTHER PUBLICATIONS

Kong, Meng, et al., "Localized and Whole-Room Effects of Portable Air Filtration Units on Aerosol Particle Deposition and Concentration in a Classroom Environment". ACS EST Engg, 2022, 2, 653-669.*

Notice of Submission of Publication from Japanese Patent Application No. 2020-041075 dated Jul. 14, 2022, and English translation of the notice.

Office Action for Japanese Patent Application 2020-041075 dated Sep. 13, 2022, and its English translation provided by client.

* cited by examiner

METHOD FOR PREVENTING CONTAMINATION OF BASE PLATE

BACKGROUND

Technical Field

The present invention relates to a method for preventing contamination of a base plate to be used for producing polycrystalline silicon.

The present application claims the priority of Japanese Patent Application No. 2020-041075 filed on Mar. 10, 2020, the contents of which are entirely incorporated by reference.

Related Art

Polycrystalline silicon is a raw material for single crystal silicon for semiconductor manufacturing and silicon for solar cell manufacturing. Siemens method is known as a method for producing polycrystalline silicon. By this method, generally, a silane-based raw material gas is brought into contact with a heated silicon core wire to deposit polycrystalline silicon on the surface of the silicon core wire by chemical vapor deposition (CVD).

The reactor used in Siemens method generally consists of a bell-shaped lid called bell jar and a bottom part called a base plate provided with an electrode, a raw material gas supply port, an exhaust air port, etc., which are connected to each other by a flange.

The electrode penetrates the base plate with an insulator in between and is connected to another electrode through wiring or connected to a power source located outside the reactor. The electrode, base plate, and bell jar are cooled by the use of a refrigerant such as water to prevent polycrystalline silicon from depositing during vapor phase growth or to prevent metal temperatures from rising and causing heavy metal contamination in the polycrystalline silicon.

The silicon core wire fixed to the electrode or the core wire holder is heated by Joule heat. A raw material gas supplied from a gas nozzle, for example, a mixed gas of trichlorosilane and hydrogen is sprayed onto the silicon core wire to cause vapor-deposition of high-purity silicon on the silicon core wire, thereby forming a silicon rod.

After finishing the growth of the silicon rod, the silicon rod is sufficiently cooled. After the reactor is filled with a harmless gas, flange bolts of the bell jar and base plate are removed. The bell jar is lifted by a crane and carried to a bell jar washer for washing with high-pressure washing water or the like. The base plate is cleaned of fragments of the silicon rod that have fallen on the base plate after the silicon rod is harvested. Harvesting of the silicon rod and cleaning of the base plate are done manually by the worker.

After cleaning the base plate, a new core wire and core wire holder are set to the electrode on the base plate, and the cleaned bell jar is carried by the crane again and reconnected to the bale plate with the flange.

In recent years, the demand for reducing impurities in polysilicon rods has been increasing more and more. In particular, contamination of inside (bulk) of polysilicon rods cannot be washed and removed in the following processes unlike surface contamination and thus greatly affects the quality of the products.

Impurities included in the bulk can be attributed to factors such as impurities included in the raw material gas itself, the reactor material, and surface contamination on the inner surface of the reactor. It is known that the surface stains on the inner surface of the reactor are affected by the surrounding atmosphere while the reactor is open and the cleanliness of the inner surface of the reaction vessel immediately before closing the reactor.

Therefore, the base plate is cleaned, for example, as described in JP 6395924 B2. Further, an attempt is made to keep clean the entire room including the reactor as described in JP 2016-536249 A and JP 2016-521239 A.

SUMMARY

However, it is not sufficient to clean the base plate as in JP 6395924 B2. The base plate has a complicated shape with electrodes, a raw material gas supply port, an exhaust gas port, and the like, and may have countless small scratches due to the collapse or partial drop of the silicon rod. Thus, it is very difficult to completely remove the dirt from the contaminated base plate and return the base plate to a clean state.

In addition, excessive cleaning may make new scratches on the base plate, which causes dirt to remain. Furthermore, the cleaning tool itself may be missing and remain on the bale plate, causing contamination.

As in JP 2016-536249 A, impurities can be reduced by keeping clean the entire room with the reactor in a clean room environment. However, this must be planned from the beginning of the room design. Furthermore, it is economically difficult to create and maintain a clean room in which a large number of Siemens reactors can be installed.

Even if the entire room is in a clean room environment, particles generated by the work performed by workers inside the room, metal powder and oil generated by the use of cranes and balances used to move the bell jar and the like, are generated from contamination sources existing inside the room. There is a problem that the effect cannot be immediately obtained for such newly generated contamination.

According to JP 2016-521239 A, the room is cleaned at regular intervals, but there is a problem that the effect cannot be immediately obtained against newly generated contamination as described above.

Therefore, the present invention provides a means for preventing contamination of the base plate used for producing polycrystalline silicon without costing.

[Concept 1]

A method for preventing contamination of a base plate according to claim 1 may comprise:

a step of, after producing polycrystalline silicon in a reactor having the base plate and a lid covering the base plate, removing the lid from the base plate; and a step of isolating space including the base plate by an isolation device.

[Concept 2]

In the method for preventing contamination of the base plate according to concept 1, the isolation device may have a filter unit capable of blowing a gas onto the base plate through a filter, and in the step of isolating the space including the base plate by the isolation device, the filter unit may blow the gas onto the base plate.

[Concept 3]

In the method for preventing contamination of the base plate according to concept 2, the filter unit may supply, per hour, a gas 30 times or more larger in volume than capacity of the isolation device.

[Concept 4]

In the method for preventing contamination of the base plate according to concept 2, the filter unit may supply, per hour, a gas 90 times or more larger in volume than capacity of the isolation device.

[Concept 5]

In the method for preventing contamination of the base plate according to any one of concepts 1 to 4, the isolation device may have a moving part, and before the step of isolating the space including the base plate by the isolation device, the isolation device may be moved by using the moving part.

[Concept 6]

The method for preventing contamination of the base plate, according to any one of concepts 1 to 5, may further comprise a step of, after removing the isolation device and installing the lid on the base plate, starting production of a next polycrystalline silicon.

[Concept 7]

In the method for preventing contamination of the base plate according to any one of concepts 1 to 6, isolating the space including the base plate by the isolation device may be performed in 70% or more of a time from removal of the lid from the base plate after an end of production of the polycrystalline silicon to installation of the lid on the base plate for starting production of a next polycrystalline silicon.

In the present invention, by adopting the aspect of separating the space including the base plate by the isolation device is adopted, it is possible to prevent contamination of the base plate used for producing polycrystalline silicon.

DETAILED DESCRIPTION

Figure 1:
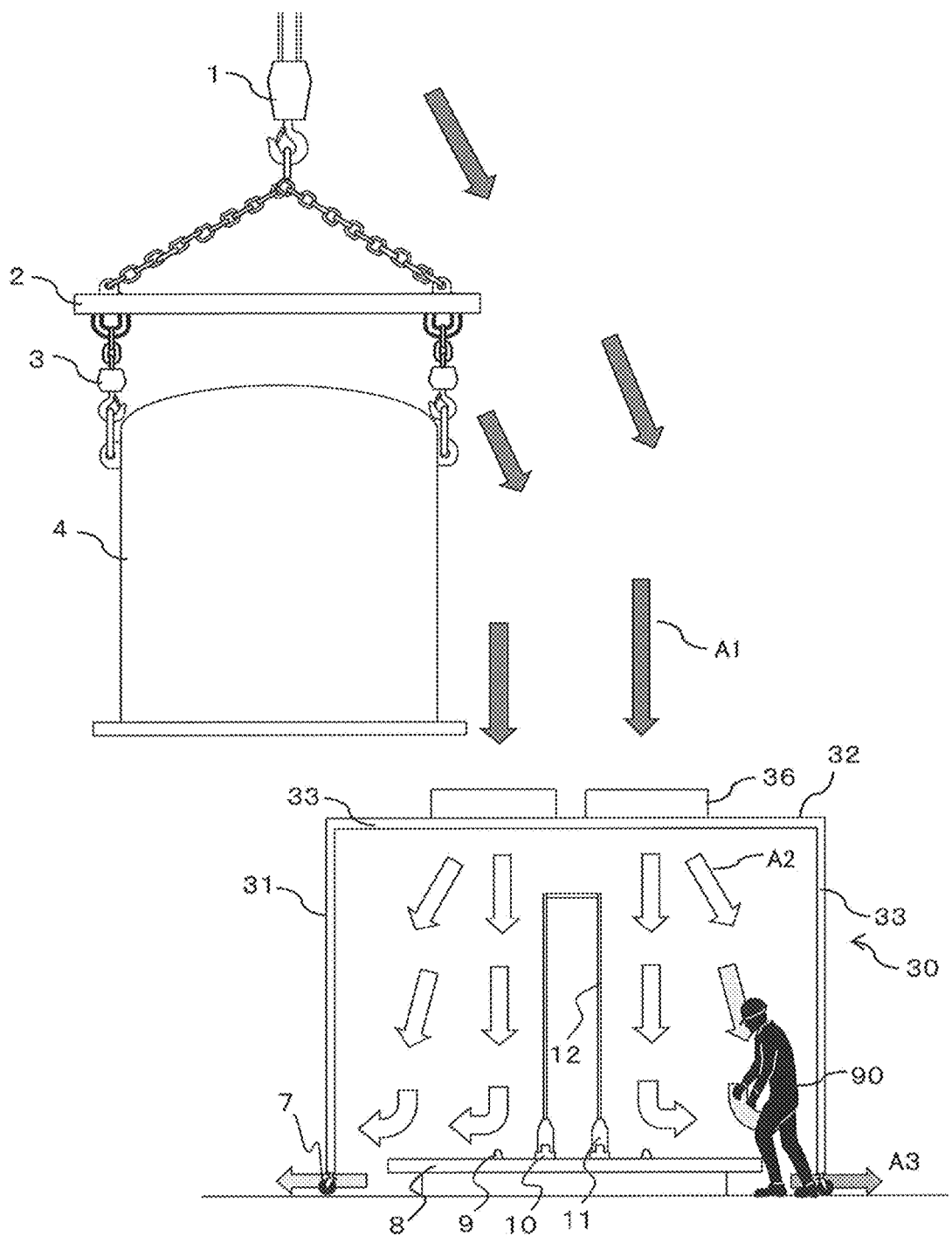
FIG. 1 is a diagram showing a mode in which a base plate is isolated and protected by using an isolation device according to an embodiment of the present invention, and is a diagram showing a side cross section of a bell jar and a side cross section of the isolation device.

The reactor has a base plate 8 and a bell jar 4 which is a lid connected to the base plate 8. FIG. 1 shows a mode in which the bell jar 4 is separated from the base plate 8, but when used, the bell jar 4 is attached to the base plate 8 via a flange or the like.

The base plate 8 is provided with a raw material gas supply nozzle 9 for supplying a raw material gas, an electrode 10, a core wire holder 11 provided on the electrode 10, and a silicon core wire 12 provided on the core wire holder 11. To produce polycrystalline silicon, polycrystalline silicon is deposited on the surface of the silicon core wire 12 by, for example, chemical vapor deposition (CVD).

An isolation device 30 may have a partition 31 extending in the vertical direction and a ceiling part 32 provided on the top surface (upper surface) of the partition 31. The partition 31 may be held by a support column 33 extending in the vertical direction and a support column 33 extending in the horizontal direction. The partition 31 may be made of vinyl or the like.

The bell jar 4 removed from the base plate 8 may be moved by the crane 1 via a balance 2 and hooks 3. The base plate 8 can be opened and closed by moving it in the vertical direction or the horizontal direction. The bell jar 4 removed from the base plate 8 is moved to a bell jar washer such as a bell jar washing table. When the bell jar is moved, contaminated air A1 that includes lubricating oil used in the components and minute metal powder generated by the interference of the components flows toward the ground surface. In the present embodiment, in order to prevent the contaminated air A1 from reaching the base plate 8, an isolation device 30 capable of isolating the space is installed so as to cover the entire base plate 8. This allows the base plate 8 to be isolated and protected, and as a result, contamination of the surface of the base plate 8 can be prevented.

In the present embodiment, the bell jar 4 may be moved until a space for installing the isolation device 30 is secured, and at that time the movement of the bell jar 4 may be stopped. Then, after covering the base plate 8 with the isolation device 30, the movement of the bell jar 4 may be restarted. According to this mode, it is advantageous in that the contamination of the surface of the base plate 8 due to the movement of the bell jar 4 can be prevented as much as possible.

Figure 2:
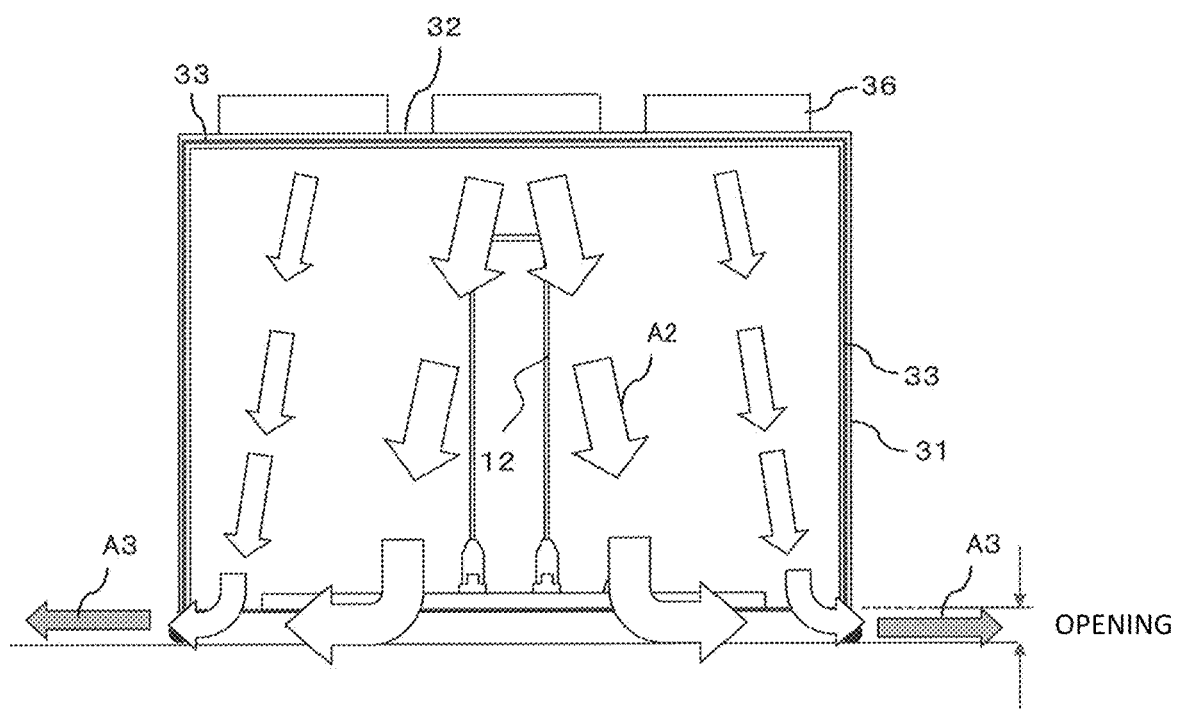
FIG. 2 is a side sectional view of a mode in which the isolation device according to the embodiment of the present invention has a filter unit.

As shown in FIG. 2, the isolation device 30 may have fan filter units (FFUs) 36 on a ceiling part 32. When this mode is adopted, purified air A2 can be blown directly onto the base plate 6. Therefore, even if a worker 90 (see FIG. 1) performs work such as standing the silicon core wire 12 in the isolated and protected space, it is possible to prevent the air 15 including the powder dust generated by the work from reaching the base plate 8 and keep the base plate 8 clean.

For the FFUs 36, it is preferable to use HEPA filters, and it is more preferable to use ULPA filters. For the FFUs 36, it is even more preferable to use low organic substance/low boron ULPA filters.

The isolation device 30 does not necessarily have to be used to the base plate 8 all the time during the opening of the reactor (while the bell jar 4 is removed from the base plate 8). For example, the isolation device 30 may be used only for the time when the generation of dust such as metal powder is expected during the movement of the bell jar 4 or the cleaning of the room.

The isolation device 30 may be assembled on the spot or carried by a crane or the like. From the viewpoint of not generating powder dust, it is advantageous that the isolation device 30 is provided with moving parts 7 such as casters.

When polycrystalline silicon is grown in the reactor by Siemens method, hydrochloric acid will be generated as a by-product. Therefore, in this case, the isolation device 30 is used in an acidic atmosphere. In view of this matter, it is desirable to protect the metal parts such as the exteriors of the FFUs 36 and the frame of a clean booth by wrapping tape so that they will not rust due to the acidic atmosphere.

It is also effective to apply a resin coating to metal parts such as the exteriors of the FFUs 36 and the frame of the clean booth. It is preferable to decrease outgas of the coating resin because it has the effect of further reducing the contamination of the cleaned base plate 8.

The cause of metal contamination, especially Zn intrusion, has been unknown. However, the inventor's diligent efforts to investigate the contamination source has revealed that the contamination occurs mainly because zinc plating on the inner surface of the air conditioner filter room and the air duct becomes peeled off due to corrosion or the like, and the zinc plating enters into the room.

Thus, it has been found that, at work on the base plate 8, in particular, at the cleaning of the base plate 8 and the installation of a silicon core wire for growing polycrystalline silicon by Siemens method, isolating the work space by the isolation device 30 for a short period of time would be effective for preventing metal contamination.

In addition, the worker 90 who works in the space isolated by the isolation device 30 wears a helmet for safety, and wears a mask, goggles, nitrile gloves, and dustproof clothing in order to clean the base plate 8 and install a new core wire.

At and after removal of the polycrystalline silicon, fragments of the polycrystalline silicon are cleared with the use of Kepler gloves, an apron, a protector, and the like to prevent cuts caused by the fragments.

At this time, it is desirable to discharge a downflow of air through the FFUs 36 in the isolation device 30 to the outside of the system without disturbing it so that the contaminants Na and Ca generated from the worker 90 do not adhere to the base plate 8 (see FIG. 2). In order to produce the downflow via the FFUs 36, it is preferable to provide openings at the bottom of the partition 31 of the isolation device 30 so that the downflow is exhausted to the outside of the system without disturbing the air flow inside the isolation device 30.

The openings are preferably evenly provided over the entire partition 31. Considering the amount of air blown into the isolation device 30 by the FFUs 36, the greater the ventilation frequency of the space in a certain period of time, the greater the amount of air blown into the isolation device 30 by the FFUs 36. In order not to disturb the air flow, it is desirable to adjust the width of the openings as appropriate. The width of the openings may be changed by adjusting the height of the isolation device 30, or may be changed by adjusting the vertical length of the partition 31.

Figure 3:
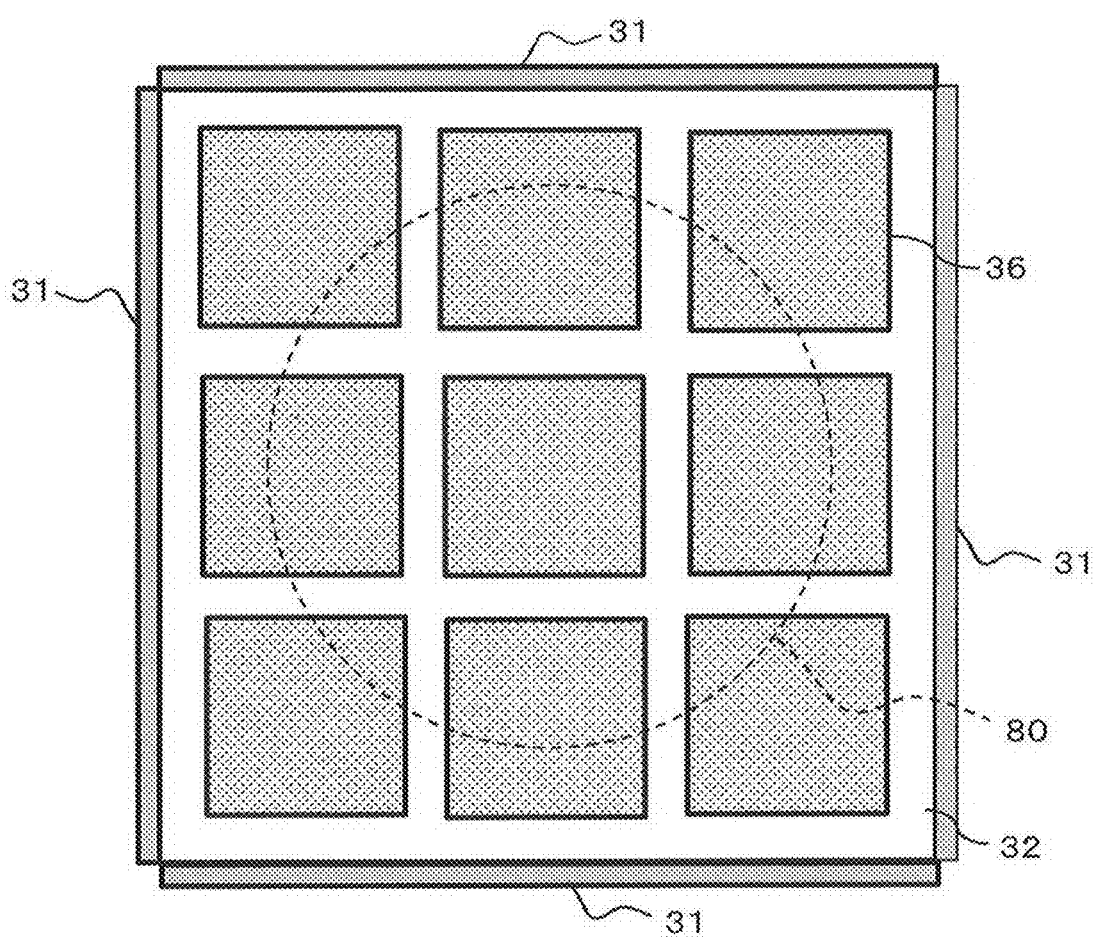
FIG. 3 is an upper plan view of the mode in which the isolation device according to the embodiment of the present invention has the filter unit.

Further, as shown in FIG. 3, when the shape of the isolation device 30 is square when viewed from above, there is a difference in the air volume at the lower part of the partition 31. Therefore, it is also preferable to make the openings at the center of the partition 31 larger than the openings at the ends (corners) of the partition 31 in the plan view seen from above so that the air flow becomes not disturbed. In FIG. 2, the air including powder dust is denoted with reference sign A3.

In the isolation device 30, the downflow of air from the FFUs 36 may become disturbed by hitting the worker 90 (see FIG. 1). When the air flow becomes disturbed in this way, the air flow may become unlikely to be discharged from the isolation device 30 to the outside of the system. In this case, Na and Ca may remain in the isolation device 30, which is not preferable because the amounts of Na and Ca adhering to the base plate 8 and the silicon core wire being installed will increase. Therefore, it is preferable to direct the downflow of air from the FFUs 36 to the outside of the isolation device 30 system.

Specifically, it is conceivable to adopt a method by which to weaken the air flow from the center of the isolation device 30 toward the outside. As shown in FIG. 2, by increasing the volume of air from the central the FFUs 36 and weakening the volume of air from the peripheral FFUs 36, it is possible to discharge the air flow inside the isolation device 30 from the outside of the system without causing a disturbance in the air flow. Referring to the mode shown in FIG. 3, it is conceivable to make the volume of air from the FFU 36 located in the center larger than the volume of air from the eight FFUs 36 arranged surrounding the central FFU 36.

Instead of or in addition to this mode, an oblique air flow may be generated from the center of the isolation device 30 toward the outside (see arrow A2 in FIG. 2) so that the air flow having hit the worker 90 can be pushed out of the system.

This is preferable because the higher the velocity of the entire air flow, the faster the contaminants will be discharged to the outside of the system. The frequency of ventilation in the space is preferably 30 times/h or more because the effect of reducing contaminants will be remarkable. The frequency of ventilation in the space is more preferably 90 times/h or more. In the present embodiment, the frequency of ventilation is represented as n times/h, which means that air n times the volume of the space in the isolation device 30 is blown in one hour. Therefore, when the frequency of ventilation in the space is 30 times/h or more, this means that air 30 times larger in volume than the capacity of the space in the isolation device 30 is blown per hour, and when the frequency of ventilation in the space is 90 times/h or more, this means that air 90 times larger in volume than the capacity of the space in the isolation device 30 is blown per hour.

When the isolation device 30 is viewed from above, the air volume within ½ of the area of a circle in the center (see reference sign 80 in FIG. 3) divided by the partition 31 is preferably 1.5 times the air volume outside the circle, more preferably 1.8 times, and even more preferably 2.0 times.

Figure 4:
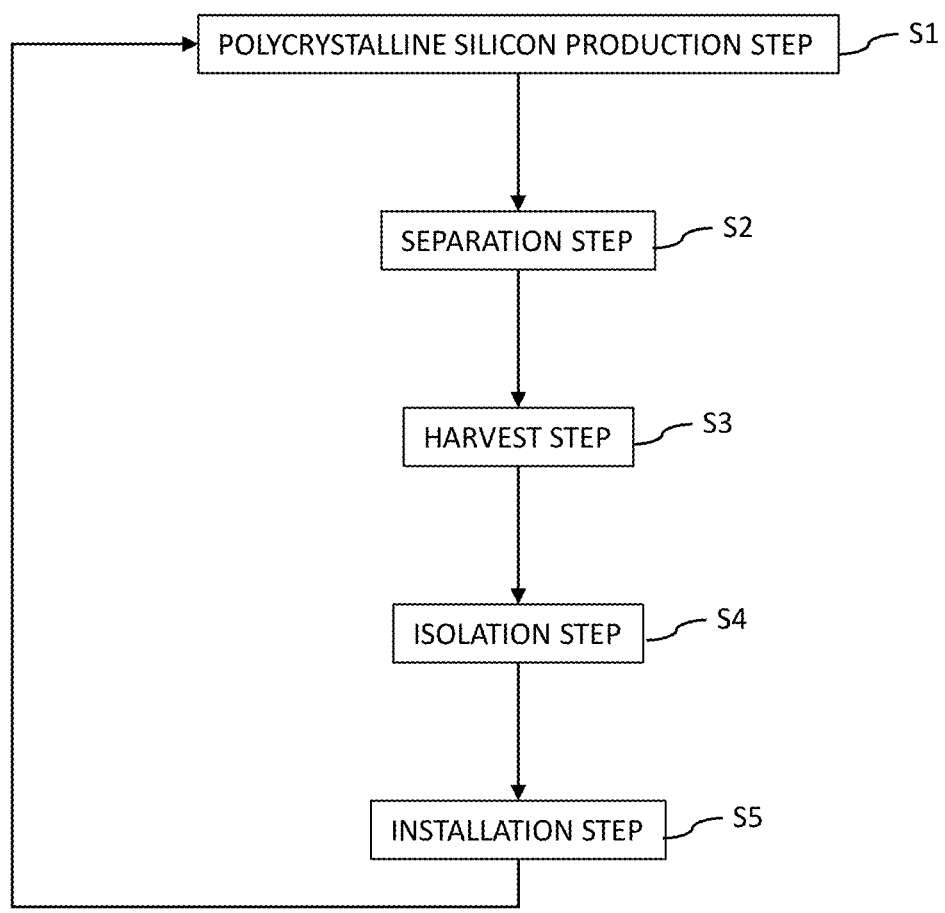
FIG. 4 is a flow chart for explaining a mode using an isolation device.

Next, an example of the mode in which the isolation device 30 is used will be described with reference to FIG. 4.

Certain polycrystalline silicon (the current polycrystalline silicon) is produced by Siemens method in a reactor having the base plate 8 and the bell jar 4 which is a lid covering the base plate 8 (polycrystalline silicon production step S1).

After the production of the certain polycrystalline silicon is finished, the bell jar 4 is removed from the base plate 8 (separation step S2).

Next, the produced certain polycrystalline silicon is harvested (harvesting step S3).

After the polycrystalline silicon is harvested, the space including the base plate 8 from which the bell jar 4 has been removed is isolated by the isolation device 30 (isolation step S4). The isolation device 30 may be moved by using the moving parts 7 including casters or the like. With the space including the base plate 8 isolated by the isolation device 30, the produced polycrystalline silicon is harvested, and the base plate 8 is cleaned.

The isolation by the isolation device 30 is performed after the bell jar 4 is removed from the base plate 8 after the production of the polycrystalline silicon is completed and the harvesting of the polycrystalline silicon is completed. Then, the period of time from the isolation by the isolation device 30 to the removal of the isolation device 30 for the next preparation is set as isolation time.

When the period of time from the removal of the bell jar 4 from the base plate 8 after the production of the polycrystalline silicon to re-installation of the bell jar 4 on the base plate 8 to start the production of the next polycrystalline silicon is set as release time, the isolation time may occupy 70% or more of the release time. However, in order to shorten the time of exposure to the outside air, the isolation time may occupy 80% or more of the release time.

After the removal of the bell jar 4 from the base plate 8, the polycrystalline silicon is harvested promptly. The time required for this harvest is, for example, between 0.5 hours and 1.5 hours inclusive. The time required for, after the harvesting of the polycrystalline silicon, isolating the base plate 8 by the isolation device 30 is, for example, about 5 to 10 minutes. The time from the removal of the bell jar 4 from the base plate 8 to re-installation of the bell jar 4 on the base plate 8 to start the production of the next polycrystalline silicon is, for example, 3 hours to 12 hours inclusive.

While the space including the base plate 8 is isolated by the isolation device 30, the filter units attached to the isolation device 30 may supply a gas 30 times or more larger in volume than the capacity of the isolation device 30 per hour (may be 30 times/h or more). More preferably, while the space including the base plate 8 is isolated by the isolation device 30, the filter units attached to the isolation device 30 may supply a gas 90 times or more larger in volume than the capacity of the isolation device 30 per hour (may be 90 times/h or more). The capacity of the isolation device 30 means the capacity of the space surrounded by the isolation device 30, and means the capacity of the space surrounded by the partition 31 and the ceiling part 32 (see an upper area than the opening).

The isolation device 30 is removed and the bell jar 4 is re-installed on the base plate 8 (installation step S5). After that, the production of the next polycrystalline silicon (following polycrystalline silicon) is started by Siemens method. After that, the set of steps described above are repeated.

EXAMPLES

Next, Examples will be described.

By the reaction technique according to Siemens method, the air near the top of the base plate 8 was collected by an impinger for 7.0 hours from the harvesting of the polycrystalline silicon rod to the closing of the bell jar including completely standing the core wire, and the influence on the air was checked. 230 g of pure water was used as collection liquid, and the suction amount was set to 2.0 L/min. After the collection, metal components in the collection liquid were directly analyzed by ICP-MS. In both Examples and Comparative Example described later, the time from removal of the bell jar 4 from the base plate 8 to harvesting of the polycrystalline silicon was 1.0 hour.

Comparative Example 1

Work was carried out for 8.0 hours after opening the reactor, especially without protecting the base plate 8.

Example 1

After the reactor was opened and the polycrystalline silicon rod was harvested spending 1.0 hour, the base plate 8 was protected and isolated from the surrounding space by the isolation device 30 having the support column 33 and the partition 31 made of vinyl. In this case, the isolation time was 6.4 hours (it took 0.1 hours to protect the base plate 8 by the isolation device 30 after harvesting the polycrystalline silicon rod, and it took 0.5 hours to remove the isolation device 30 and re-install the bell jar 4 on the base plate 8). As a result, contamination with metals such as Zn, Ni, and Fe was significantly prevented. In addition, contamination with Ca considered to have been mixed from outside the isolation device 30 was reduced to about ¼. In Example 1, the isolation time occupies 80% (=6.4/8.0) of the release time.

Example 2

After the reactor was opened and the polycrystalline silicon rod was harvested spending 1.0 hour, the base plate 8 was protected and isolated from the surrounding space by the isolation device 30 having the support column 33 and the partition 31 made of vinyl. The frequency of ventilation in the space isolated by the FFUs 36 (ULPA filters manufactured by NITTA) attached to the upper part was adjusted to 30 times/h. Metal parts such as the exteriors of the FFUs 36 and the frame of the housing of the isolation device 30 were protected with tape as an anti-rust measure at work in an acidic atmosphere. This further reduced Ca and Na that were thought to be generated by the worker 90. In Example 2, as in Example 1, the isolation time was 6.4 hours (it took 0.1 hours to protect the base plate 8 by the isolation device 30 after harvesting the polycrystalline silicon rod, and it took 0.5 hours to remove the isolation device 30 and re-install the bell jar 4 on the base plate 8).

Example 3

After the reactor was opened and the polycrystalline silicon rod was harvested spending 1.0 hour, the base plate 8 was protected and isolated from the surrounding space by the isolation device 30 having the support column 33 and the partition 31 made of vinyl. The frequency of ventilation in the space isolated by the FFUs 36 attached to the upper part was adjusted to 90 times/h. This further reduced Na and Ca that were thought to be generated by the worker 90. In Example 3, as in Examples 1 and 2, the isolation time was 6.4 hours (it took 0.1 hours to protect the base plate 8 by the isolation device 30 after harvesting the polycrystalline silicon rod, and it took 0.5 hours to remove the isolation device 30 and re-install the bell jar 4 on the base plate 8).

The results of Comparative Example 1 and Examples 1 to 3 are shown in the table below.

TABLE 1

Unit: pptw

| Element | Na | Cr | Fe | Ni | Cu | Zn | Ca |
|---|---|---|---|---|---|---|---|
| Comparative Example 1 | 397 | 1 | 22 | 84 | 5 | 239 | 2335 |
| Example 1 | 303 | 2 | 3 | 27 | 1 | 30 | 641 |
| Example 2 | 120 | 1 | 8 | 9 | 0 | 2 | 203 |
| Example 3 | 13 | 0 | 9 | 1 | 0 | 3 | 37 |

It has been confirmed that Fe, Ni, Zn and Ca were particularly reduced by isolating the base plate 8 from the surrounding space by an isolation device. It has also been confirmed that Na and Ca, which were thought to be generated by the worker 90, were reduced by flowing clean air onto the base plate 8.

Further, it has been confirmed that Na and Ca were further reduced by increasing the frequency of ventilation to 30 times/h and 90 times/h.

REFERENCE SIGNS LIST

1 Crane
2 Balance
3 Hook
4 Bell jar (lid)
7 Moving part
8 Base plate
9 Raw material gas supply nozzle
10 Electrode
11 Core wire holder
12 Silicon core wire
30 Isolation device
31 Partition 36 Filter unit (FFU)
80 Circle showing the area of ½ from the center of the isolation device
90 Worker
A1 Contaminated air
A2 Clean air
A3 Air including powder dust

What is claimed is:

1. A method for preventing contamination of a base plate comprising:
    removing a lid from the base plate after producing polycrystalline silicon in a reactor having the base plate and the lid covering the base plate; and
    isolating a space including the base plate by an isolation device different from the lid, after removing the lid, wherein the isolation device comprises a filter unit configured to blow filtered air onto the base plate through a filter, and
    wherein the method further comprises blowing filtered air onto the base plate via the filter unit.

2. The method for preventing contamination of the base plate according to claim 1, wherein the filter unit is configured to supply, per hour, filtered air 30 times or more larger in volume than capacity of the isolation device.

3. The method for preventing contamination of the base plate according to claim 1, wherein the filter unit is configured to supply, per hour, filtered air 90 times or more larger in volume than capacity of the isolation device.

4. The method for preventing contamination of the base plate according to claim 1, wherein
    the isolation device comprises a moving part, and
    before isolating the space including the base plate by the isolation device, the isolation device is configured to be moved by the moving part.

5. The method for preventing contamination of the base plate according to claim 1, further comprising, after removing the isolation device and installing the lid on the base plate, starting a next production of polycrystalline silicon.

6. The method for preventing contamination of the base plate according to claim 1, wherein isolating the space including the base plate by the isolation device is performed in 70% or more of a time from removal of the lid from the base plate after an end of production of the polycrystalline silicon to installation of the lid on the base plate for starting a next production of polycrystalline silicon.

* * * * *